US008234624B2

(12) United States Patent
Devins et al.

(10) Patent No.: US 8,234,624 B2
(45) Date of Patent: Jul. 31, 2012

(54) SYSTEM AND METHOD FOR DEVELOPING EMBEDDED SOFTWARE IN-SITU

(75) Inventors: Robert J. Devins, Essex Junction, VT (US); Nagashyamala R. Dhanwada, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1589 days.

(21) Appl. No.: 11/626,967

(22) Filed: Jan. 25, 2007

(65) Prior Publication Data
US 2008/0184193 A1 Jul. 31, 2008

(51) Int. Cl.
*G06F 9/44* (2006.01)
(52) U.S. Cl. ........ 717/106; 717/114; 717/116; 717/121; 703/13; 703/21; 703/22; 703/23; 716/100; 716/108; 716/132
(58) Field of Classification Search .................. None
See application file for complete search history.

(56) References Cited

U.S. PATENT DOCUMENTS

| | | | |
|---|---|---|---|
| 4,306,286 A | 12/1981 | Cocke et al. | |
| 4,527,249 A | 7/1985 | Van Brunt | |
| 4,862,347 A | 8/1989 | Rudy | |
| 4,985,860 A | 1/1991 | Vlach | |
| 5,081,608 A | 1/1992 | Tamura et al. | |
| 5,247,651 A | 9/1993 | Clarisse | |
| 5,673,418 A | 9/1997 | Stonier et al. | |
| 5,710,934 A * | 1/1998 | Bona et al. .................. | 714/724 |
| 5,870,588 A * | 2/1999 | Rompaey et al. ........... | 703/13 |
| 5,943,490 A | 8/1999 | Sample | |
| 6,052,524 A | 4/2000 | Pauna | |
| 6,179,488 B1 * | 1/2001 | Wilson ........................ | 703/23 |
| 6,275,785 B1 | 8/2001 | Currie et al. | |
| 6,466,898 B1 | 10/2002 | Chan | |
| 6,691,301 B2 * | 2/2004 | Bowen ....................... | 717/114 |
| 7,051,299 B2 * | 5/2006 | Chadha et al. ............. | 716/106 |
| 7,159,223 B1 * | 1/2007 | Comeau ..................... | 719/310 |
| 7,353,156 B2 * | 4/2008 | Devins et al. .............. | 703/14 |
| 7,584,465 B1 * | 9/2009 | Koh et al. .................. | 717/162 |
| 8,037,432 B2 * | 10/2011 | Andreev et al. ............ | 716/100 |
| 2001/0049594 A1 * | 12/2001 | Klevans ..................... | 703/14 |
| 2003/0204830 A1 * | 10/2003 | Brawn et al. .............. | 716/17 |
| 2004/0054976 A1 * | 3/2004 | Takahashi et al. .......... | 716/8 |

(Continued)

OTHER PUBLICATIONS

System-Level Modeling and Performance evaluation Methodology, Patricia Sagmeister, Andreas Herkersdorf, RDn455 Mar. 2002 #137, p. 498.

*Primary Examiner* — Isaac Tecklu
(74) *Attorney, Agent, or Firm* — Downs Rachlin Martin PLLC

(57) ABSTRACT

A development system for developing new peripheral software code for new peripheral hardware that will be used in a new integrated system. The development system includes a legacy, or preexisting, integrated system substantially the same as the new integrated system. A model of the new peripheral hardware is made. Each I/O register of the model is mapped into memory-mapped I/O space. Development code corresponding to the new peripheral software code is executed on the preexisting hardware so as to interact with the model via the memory-mapped I/O space. In one embodiment, the model is executed as an embedded model on the preexisting integrated system. In another embodiment, the model is executed as a non-embedded model on a hardware descriptive language simulator.

21 Claims, 2 Drawing Sheets

U.S. PATENT DOCUMENTS

| | | | |
|---|---|---|---|
| 2004/0186928 A1* | 9/2004 | Fukunaga et al. | 710/15 |
| 2004/0199889 A1* | 10/2004 | Earnshaw et al. | 716/6 |
| 2004/0216093 A1* | 10/2004 | Kawakatsu | 717/136 |
| 2004/0243959 A1* | 12/2004 | Takemura | 716/7 |
| 2005/0076314 A1* | 4/2005 | Matsui et al. | 716/1 |
| 2005/0160410 A1* | 7/2005 | Narisawa et al. | 717/141 |
| 2006/0294436 A1* | 12/2006 | Sakai | 714/39 |
| 2007/0006150 A9* | 1/2007 | Walmsley | 717/120 |

* cited by examiner

SYSTEM AND METHOD FOR DEVELOPING EMBEDDED SOFTWARE IN-SITU

FIELD OF THE INVENTION

The present invention generally relates to the field of integrated systems. In particular, the present invention is directed to a system and method for developing embedded software in-situ.

BACKGROUND

Development managers and architects for today's system-on-a-chip (SoC) designs can choose from a wide range of development tools and methodologies to achieve development goals in the hardware/software co-development space. As is well-known, an SoC is a single chip that forms a self-contained system that generally includes one or more microcontroller, microprocessor and/or digital signal processor cores, one or more memories, one or more input/output (I/O) devices and software for controlling the system, including the I/O devices. One concern of developers of embedded software, such as used in an SoC, is achieving timely access to target hardware on which to run code. This is particularly true in the case of SoC applications because product time-to-market pressure is high.

Because of this high time-to-market pressure, software developers are forced to develop the software in parallel with the hardware that will make up the final SoC product. This means that the actual hardware on which the software will run is not available during development. Consequently, current state-of-the-art SoC software development often relies on hardware emulation, or software co-simulation to provide a development environment for the new software code. In emulation or co-simulation, the hardware is mapped onto an emulation/co-simulation platform that mimics the behavior of the entire SoC. Once programmed, the emulation/co-simulation platform enables both the hardware and the software of the SoC to be tested and debugged. The main constituents of a software co-simulation platform are models of hardware blocks at different levels of abstraction (transaction-level, cycle-accurate, behavioral to name a few) written in industry standard languages (e.g., SystemC, VHDL, Verilog). The process of developing embedded software on such hardware emulation/software co-simulation platforms can be very slow compared to the speed of the actual SoC hardware on which the software will eventually run.

For example, booting up complex code, such as operating system code, on an emulator/co-simulation takes an excessively long time and is, therefore, not practical. Consequently, a drawback of this process is that the development code must be executed on the emulator in small segments. Breaking up the development code into these small segments is very time-consuming and inefficient. Additionally, debugging the development code via simulation software does not allow its execution at full, or even near full, system operating speeds.

SUMMARY OF THE DISCLOSURE

One embodiment of the present disclosure is directed to a method of developing new peripheral code for new peripheral hardware for use with a new integrated system having first base operating environment. The method comprises providing a preexisting integrated system having second base operating environment substantially similar to the first base operating environment. Peripheral development code is loaded into the preexisting integrated system and a model of the new peripheral hardware is provided. The model is mapped into a register space within a memory. Said development code is executed in the preexisting integrated system so as to cause the peripheral development code to interact with the model via the register space.

Another embodiment of the present disclosure is directed to a system for developing new peripheral code for use in conjunction with new peripheral hardware having at least one core register. The system comprises a central processing unit (CPU) and memory in operative communication with the CPU and including register space corresponding to the at least one core register of the new peripheral hardware. System software stored in the memory for execution by the CPU so as to provide an existing operating environment. A model of the new peripheral hardware is mapped to the register space. Development code, stored in the memory and executable by the CPU, includes instructions for functionally interacting with the model via the register space.

Yet another embodiment of the present disclosure is directed to a method of developing peripheral code for new peripheral hardware, the peripheral hardware configured to run in a first operating environment. The method includes providing first development code corresponding to the peripheral code and providing an embedded model of the new peripheral hardware. The embedded model is mapped to memory-mapped input/output (MM I/O) space. The first development code and the embedded model are executed so that the first development code and the embedded model interact with each other via the MM I/O space. Second development code corresponding to the peripheral code and a non-embedded model of the new peripheral hardware are each provided. The non-embedded model is mapped to the MM I/O space. The second development code and the non-embedded model are executed so that the second development code and the non-embedded model interact with each other via the MM I/O space.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
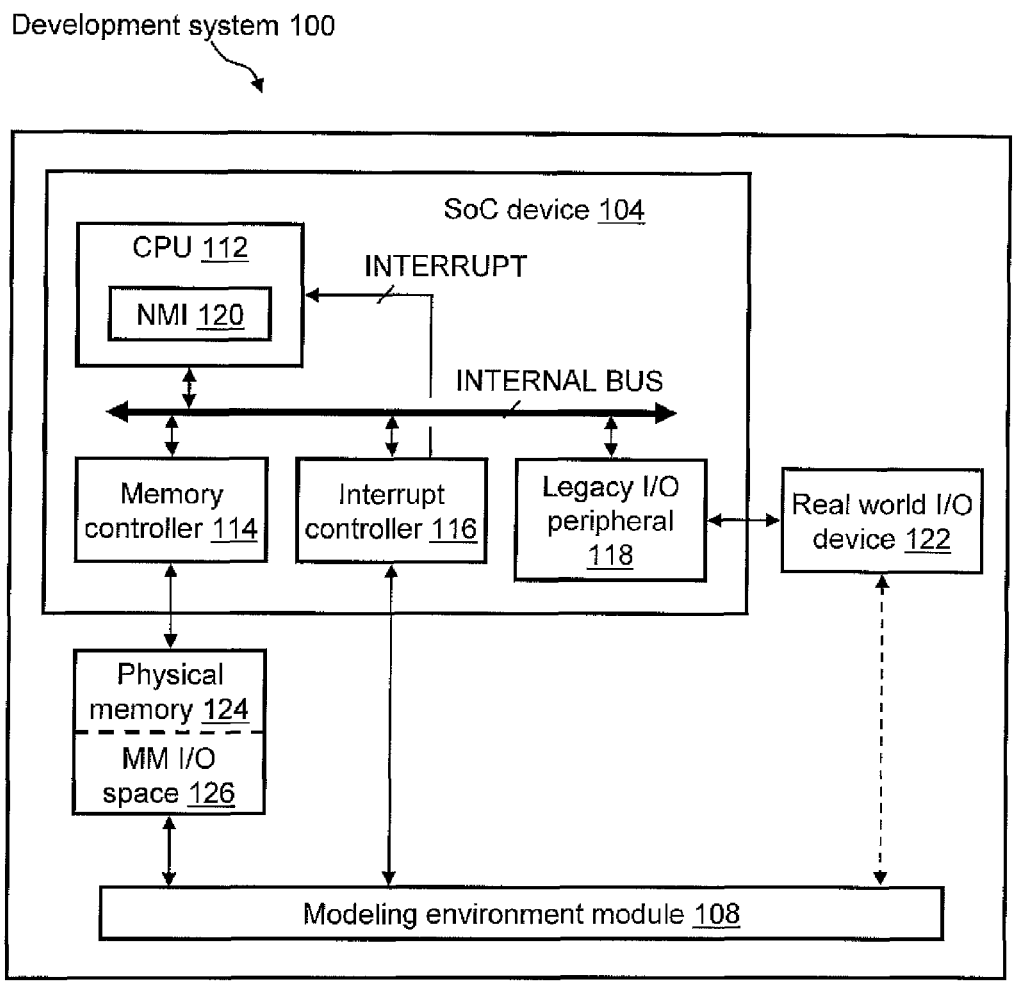
FIG. 1 illustrates a functional block diagram of a development system for performing in-situ modeling in accordance with a first embodiment of the present invention.

FIG. 1 illustrates a development system 100 made in accordance with a first embodiment of the present invention for performing in-situ modeling of an integrated system under development (not shown), e.g., a system-on-a-chip (SoC). As those skilled in the art will appreciate, the integrated system under development need not be an SoC, but rather may be any system that includes a processor and one or more peripherals, particularly where the processor and processing environment of the new system will be largely the same as an existing legacy or processor system and one or more new peripherals are being added. Examples of other applications include the design of new Unix- and PC-based integrated systems.

At a high level, development system 100 allows software developers to use in-situ modeling techniques with existing integrated system hardware, e.g., a SoC device 104, similar to new hardware that will eventually be part of the new integrated system under development so as to mimic the function of the new hardware. More particularly, development system 100 allows the software developers to run new software code (development code) for the system under development on real hardware that is very similar to the hardware under development (e.g., the bulk of the new hardware may be identical to development hardware, except for one or more new peripherals (peripheral cores), and in a base software (or operating system) environment that can be very similar, if not identical, to the base software environment of the system under development (e.g., the same operating system may be used in the system under development and only software that runs on top of the operating system, e.g., peripheral drivers, input/output drivers, etc., (generically called "peripherals" herein) may be new). As discussed below, development system 100 provides such a development environment by integrating a modeling environment software module 108 with SoC device 104.

Turning to development system 100 in more detail, SoC device 104 may, e.g., be a legacy device or a predecessor to the new system under development. SoC device 104 may include, among other things, a central processing unit (CPU) 112 (e.g., a microcontroller, microprocessor or digital signal processor), a memory controller 114, an interrupt controller 116 and an I/O peripheral 118. As those skilled in the art will readily appreciate, an SoC device suitable for use as SoC device 104 may include multiple ones of CPU 112, memory controller 114, interrupt controller 116 and I/O peripheral 118. Only one of each is shown for convenience. CPU 112 may include a non-maskable interrupt (NMI) 120. I/O peripheral 118 interacts with a real world I/O device 122 outside of SoC device 104 to produce the appropriate effect, e.g., sound in the case of the real world I/O device being an audio speaker.

Development system 100 also includes a physical memory 124 that contains a memory-mapped input/output (MM I/O) space 126. CPU 112, memory controller 114, interrupt controller 116 and legacy I/O peripheral 118 may communicate with one another via a connection to a communication bus INTERNAL BUS) to SoC device 104. The physical instantiation of the combination of SoC device 104, real world I/O device 122 and physical memory 124 to form SoC development system 100 may be accomplished, for example, via an SoC, a printed circuit board or other known electronics integration methods.

In the present embodiment, CPU 112 is a microprocessor capable of executing program instructions and is utilized for managing the overall operation of SoC device 104 and, thus, development system 100. In this example, memory controller 114 provides an interface between memory 124 and CPU 112, which handles the transfer of data going to and from the memory. Memory controller 114 manages the memory write/read protocol, which allows CPU 112 to access memory 124 and, perhaps, other memory (not shown) as well.

In the embodiment of FIG. 1, interrupt controller 116 is an interrupt handler capable of assigning priorities to incoming interrupt requests and delivering them to CPU 112 via, e.g., an electrical interrupt signal (INTERRUPT) from the interrupt controller to the CPU. INTERRUPT signal is a synchronous or an asynchronous signal from hardware or software that provides the mechanism allowing a device to request service from a processor (e.g., CPU 112). Interrupts are a commonly used technique for computer multitasking, especially in real-time computing. Hardware interrupts, such as from legacy I/O peripheral 118, cause CPU 112 to save its state of execution via a context switch (not shown) and begin handling the interrupt conditions. Software interrupts, such as from modeling environment module 108, are usually implemented as instructions in the instruction set that cause a context switch to the interrupt handler in a manner similar to a hardware interrupt. By contrast, NMI 120 of CPU 112 is a special type of interrupt that cannot be ignored by standard interrupt masking techniques. An NMI is typically used to signal attention for non-recoverable hardware errors, used for system debugging and used to handle special cases, such as system resets.

Legacy I/O peripheral 118 is SoC hardware that interfaces between CPU 112 and the outside world via real world I/O device 122. For example, if real world I/O device 122 is an audio speaker legacy I/O peripheral 118 may include an audio signal generator. Of course, real world I/O device 122 may be any existing I/O device other than an audio speaker, such as a keyboard, mouse, graphics controller and/or printer, among others, so that legacy I/O peripheral 118 will be the suitable corresponding respective peripheral for driving the real world I/O device at issue.

Physical memory 124 may be any machine-readable medium that is capable of storing information, such as data and instructions associated with software. An example of a machine-readable medium is a random access memory (RAM) device. While memory 124 is shown external to SoC device 104 in FIG. 1, physical memory 124 may, alternatively, reside internal to the SoC device as an embedded memory. In yet other embodiments, memory 124 may include two or more machine-readable media.

MM I/O space 126 is a portion of physical memory 124 that is allocated, in the context of development system 100, to the register space of the new peripheral(s) (not shown) that are under development and for which new software is being developed. In one example, MM I/O space 126 may be any 100 byte block within physical memory 124. In the context of development system 100, MM I/O space 126 mimics the registers of the peripherals under development. Memory-mapped I/O is a common hardware design methodology in which peripheral control and status registers are mapped into memory space rather than I/O space. From the software developer's point of view, memory-mapped I/O devices look very much like the device registers themselves. Their registers can even be accessed via ordinary pointers and data structures, which greatly simplifies device driver implementation. In the context of development system 100, modeling environment module 108 is interfaced to MM I/O space 126.

Modeling environment module 108 is modeling software that may be embedded in SoC device 104, e.g., within memory 124 or other memory (not shown) aboard or in communication with SoC device 104, and is implemented in any programming language that is suitable to execute on CPU 112, such as, but not limited to, a high level programming language (e.g., C/C++ programming language) and/or low level code, such as assembly language. Modeling environment module 108 provides the model environment code that performs the modeling tasks that mimic the capability of the new peripheral(s). Because in the embodiment shown modeling environment module 108 resides within the hardware of development system 100, the simulation operations of the development system may execute at full or nearly full system operating speeds. It is noted that the model(s) of the new peripheral hardware under development can be at different levels of design abstraction, e.g., transaction-level, cycle-accurate, behavioral, register-transfer level, and written in an architectural modeling language, such as SystemC or variants thereof, or a hardware description language, such as VHDL or Verilog.

The operation of a development system made in accordance with the present invention, such as development system 100 of FIG. 1, is as follows. At least three high-level operations are performed in connection with using such a development system. These operations are:

1) one or more core registers that corresponds to a new peripheral modeled in modeling environment module 108 are mapped into a memory location within the system memory of an existing integrated system (e.g., into MM I/O space 126 of physical memory 124 of development system 100);
2) development code is stored into memory (e.g., into physical memory 124) for interacting, via the mapped I/O memory location, with the new peripheral; and
3) development code is executed on the CPU in the existing software operating environment (such as on CPU 112 in the operating environment of SoC device 104).

More specifically in connection with the embodiment of FIG. 1, new development code is imported into development system 100 and is executed by CPU 112 within the base software operating environment of SoC device 104. In doing so, the base code that is associated with existing SoC device 104 and the new system under development and the new development code are run within the real-life environment of development system 100. One or more registers within the new peripheral(s) modeled in modeling environment module 108 are mapped into physical memory locations (represented by MM I/O space 126 of physical memory 124) and are available to the base software and new development code on the existing hardware side of development system 100 and the modeled new cores on the modeling environment side of the development system. The model environment (i.e., modeling environment module 108) executes as a periodic thread from the operating system, or as a periodic non-maskable interrupt (handled by NMI 120) and is, therefore, able to poll for deposits into the register space of MM I/O space 126 from the code under development. The register deposits of MM I/O space 126 are executed in the model environment code of modeling environment module 108, and responses are deposited into the register(s) of MM I/O space 126 as appropriate. When an interrupt is to be generated from a modeled peripheral, proper response values are forced into interrupt controller 116 by modeling environment module 108, which simulates an interrupt into the base software code and, thus, the interrupt handler of the new development code is exercised.

Additionally, when possible, the modeling environment code of modeling environment module 108 can utilize an existing legacy I/O peripheral (e.g., legacy I/O peripheral 118) to test new-core I/O functionality. This allows application code to interact with a real world device and, thereby, enhances the development environment. For example, if the new peripheral being modeled is a new audio signal processing core, legacy I/O peripheral 118 is an audio signal generator for driving an audio speaker (real world I/O device 122), then the legacy audio signal generator may use the output signal of the modeled audio signal processing core to drive the speaker to allow developers to test the functioning and design of the new audio signal processing core.

A development system of the present disclosure, such as development system 100 of FIG. 1, may be utilized as follows. For convenience, the following description is directed to development system 100. However, those of ordinary skill in the art will readily understand how to implement a development system in accordance with the present invention that differs from SoC device-based development system 100, e.g., is a Unix- or PC-based development system, as mentioned above.

If base software code has not yet been loaded into SoC device 104, it is loaded into the SoC device along with new peripheral development code and modeling environment module 108, including the modeled new peripheral(s). As part of the setup of development system 100, each register of the modeled peripheral(s) is mapped into physical memory, in this example MM I/O space 126, and the peripheral development code and/or base software code is configured to recognize such register(s) for allowing the peripheral development code to communicate with the modeled peripheral(s).

Once loading of all of the software, modeling environment 108 and the peripheral model(s) is complete, the execution of the base software code, the peripheral development code and the peripheral model(s) within a physical CPU, such as CPU 112 of SoC device 104, is initiated. When running, and as mentioned above, in some embodiments modeling environment module 108 may execute via the base software environment in one or more periodic threads on CPU 112 of SoC device 104. In alternative embodiments, the model environment code executes as a periodic non-maskable interrupt (handled, e.g., by NMI 120 of CPU 112) via the base software code. At the same time the modeling environment is running, the new peripheral development code is running on CPU 112 via the base software. As the modeled new peripheral cores and new peripheral development code are running, both the modeling environment module 108 and the base software/new peripheral development code poll for deposits into the corresponding respective register(s) of MM I/O space 126. In this manner, the interaction between the new peripheral development code and the modeled new peripheral(s) is simulated.

More particularly, each register deposit made into MM I/O space 126 from the new peripheral development code is executed upon by the corresponding respective modeled new peripheral(s) in modeling environment module 108, and in response, each corresponding respective new peripheral model will deposit into the register(s) of MM I/O space 126, as appropriate, the response of that new peripheral for use by the corresponding new peripheral development code. In conjunction with depositing one or more responses in MM I/O space 126, the corresponding respective ones of the modeled new peripheral cores may signal interrupt controller 116 that the response deposit(s) have been made. Once the interrupt(s) is/are pending with interrupt controller 116, the interrupt controller will provide its typical function of scheduling the interrupt(s) appropriately and issue one or more INTERRUPT signals to CPU 112 so as to signal the CPU to execute the appropriate new peripheral development code to handle the interrupt(s). Development system 100 may continue to be run for as long as needed to test all of the new peripheral development code.

Depending on the new peripherals and corresponding new peripheral code under development, existing legacy I/O peripheral 118 and real world I/O device 122 may be utilized to sample and evaluate the performance of the new peripheral development code and the new peripheral core in the context of the physical world in which the new peripherals and peripheral code under development will eventually be used when utilized in a product. By way of example, if the new peripheral development code and the new peripheral core implement an improved method of audio data compression and real-world I/O device 122 is an audio speaker and legacy I/O peripheral 118 is an audio signal generator, the audio compression algorithm under development is executed by SoC device 104 so as to drive the audio signal generator, which in turn drives the audio speaker so as to allow developers to hear the output generated by the new peripheral development code.

Figure 2:
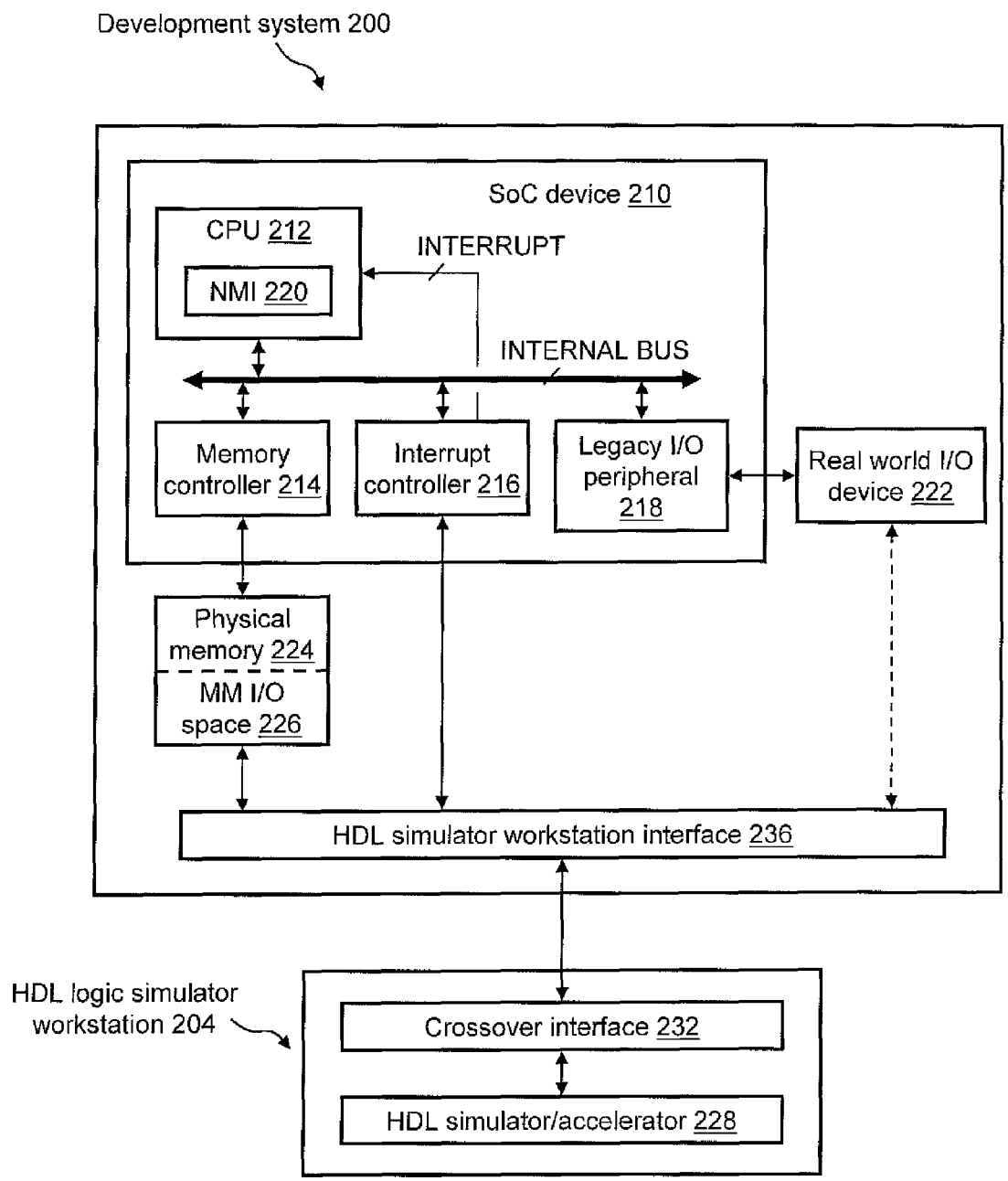
FIG. 2 illustrates a functional block diagram of a development system for performing in-situ modeling in accordance with a second embodiment of the present invention.

FIG. 2 illustrates an alternative development system 200 for performing in-situ logic modeling. Similar to development system 100 of FIG. 1, development system 200 of FIG. 2 allows software developers to use in-situ modeling techniques to mimic the function of new hardware (peripheral(s)) under development. However, instead of utilizing an embedded modeling environment 108 to emulate the new peripheral(s) under development as in development system 100 of FIG. 1, development system 200 of FIG. 2 is configured to be interfaced with a hardware descriptive language (HDL) logic simulator workstation 204, or similar external device, that provides the model(s) of the new peripheral(s) that interact with the new peripheral development code. Other aspects of development system 200 may be the same as or similar to the corresponding respective aspects of development system 100 of FIG. 1.

In one embodiment that is generally similar to development system 100 of FIG. 1, development system 200 of FIG. 2 includes an SoC device 210 that includes one or more CPUs 212, at least one memory controller 214, at least one interrupt controller 216 and one or more legacy I/O peripherals 218. CPU 212 may include an NMI 220. Development system 200 may also include one or more real-world I/O devices 222 and at least one memory 224. Memory 224 includes an MM I/O space 226 that contains one or more registers used for communications between new peripheral code under development on one side of the MM I/O space and the modeled new peripheral core(s) on the other side of the MM I/O space. Each of these elements may be as described relative to SoC development system 100 of FIG. 1.

HDL logic simulator workstation 204 may include an HDL simulator/accelerator 228. While HDL simulator/accelerator 228 is shown as being located in a separate workstation 204, in alternative embodiments the HDL simulator/accelerator may not be workstation-based. For example, HDL simulator/accelerator 228 may be incorporated into a physical module or device board that is interfaced directly to development system 200. To enable communication between HDL simulator/accelerator 228 and development system 200, HDL logic simulator workstation 204 may include a crossover interface 232 and the development system may include a corresponding respective HDL simulator workstation interface 236. HDL simulator workstation interface 236 may be, e.g., program code that allows communication between SoC device 210 and HDL simulator workstation interface 204. Similarly, crossover interface 232 may be, e.g., program code that allows communication between the development code testing environment of SoC device 210 and a HDL simulator, such as HDL simulator/accelerator 228. The connection between HDL simulator workstation interface 236 and crossover interface 232 may be any suitable high-speed connection, such as a cable connection, e.g., an Ethernet, USB or Firewire cable.

HDL simulator/accelerator 228 may be a logic simulator that allows the user to run logic simulation with acceleration. Example logic simulators/accelerators include, but are not limited to, the AWAN simulator by IBM (Armonk, N.Y.) and the VCS® simulator by Synopsys, Inc. (Mountain View, Calif.). HDL simulators describe the architectural blocks of a core design and is the traditional approach to designing the blocks from scratch. HDL simulators typically use hardware description language (HDL), which allows designers to write the necessary specifications for their hardware design. The two main HDL languages used today are Verilog and VHDL, but others may be used.

Like development system 100 of FIG. 1, development system 200 of FIG. 2 maintains all the software code in the legacy peripherals device (e.g., legacy I/O peripheral 218 in combination with real world I/O 222), but replaces the modeling environment (modeling environment module 108) with a connection to a logic simulator (HDL simulator/accelerator 228). The thread that is executed in development system 200 is the interface between the development system 200 and HDL simulator/accelerator 228, whereas SoC development system 100 of FIG. 1 is executing the actual function inside modeling environment module 108.

In the environment of SoC development system 200, development code is executed in similar fashion to the in-situ method of SoC development system 100 of FIG. 1. However, in the case of SoC development system 200, trapped MM I/O operations of MM I/O space 226 are transported to HDL logic simulator/accelerator 228. In doing so, the modeling of new hardware is achieved using HDL-based model execution, which is a more accurate representation of the new hardware, as compared with the use of the embedded model execution method of SoC development system 100 of FIG. 1.

Development systems 100, 200 provide mechanisms to utilize pre-silicon embedded models or HDL-based models, respectively, within an existing legacy system (e.g., an SoC device), in order to accomplish in-situ model execution and a bridge method to in-situ HDL simulation, respectively. The software/hardware development process may include the use of development system 100 only, development system 200 only, or both SoC development systems 100 and 200 in seriatim. Additionally, legacy (i.e., existing) peripheral hardware is used, when possible, to provide pseudo real-world I/O capability, which can be very useful to device driver and application development. Additionally, SoC development systems 100 and 200 provide the benefit of executing development software at full-speed or near full-speed, and within a familiar debug environment, while providing an extensible and accurate software development platform that helps optimize embedded software. These development systems also allow the reuse of pre-silicon modeling within the software development context and, thus, enables a new way of performing parallel development. The development systems of the present disclosure also use existing physical peripherals to generate and mimic real world data streams, which is essential to software system development and debug. Development system 200 provides an additional benefit of transparent use of HDL simulation and acceleration techniques by use of a crossover adapter.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of developing new peripheral code for new peripheral hardware for use with a new integrated system having first base operating environment, the method comprising:

providing a preexisting integrated system having second base operating environment substantially similar to said first base operating environment;

loading peripheral development code into said preexisting integrated system;

providing a model of the new peripheral hardware;

mapping said model into a register space within a memory; and executing said peripheral development code in said preexisting integrated system so as to cause said peripheral development code to interact with said model via said register space.

2. The method according to claim 1, further comprising:
modeling the new peripheral hardware in a modeling environment so as to create said model; and
executing said model on said preexisting integrated system.

3. The method according to claim 2, wherein said peripheral development code includes instructions for making deposits to said register space, the step of executing said core model including polling said register space for said deposits.

4. The method according to claim 2, wherein said step of providing said model of the peripheral hardware includes selecting a level of design abstraction from a group consisting of transaction-level, cycle-accurate, behavioral, and register-transfer level, and selecting a modeling language from a group consisting of architectural modeling languages and hardware description languages.

5. The method according to claim 3, wherein the step of executing said model on the preexisting integrated system includes executing said model as a periodic thread from said second operating environment.

6. The method according to claim 3, wherein the step of executing said model on said preexisting integrated system includes executing said model as a periodic non-maskable interrupt.

7. The method according to claim 3, wherein the step of executing said model includes generating responses to said deposits and depositing said responses in said register space.

8. The method of claim 2, wherein the preexisting integrated system further includes an interrupt controller and the step of executing said model includes pushing a response signal to said interrupt controller.

9. The method of claim 2, wherein the preexisting integrated system further includes a legacy input/output peripheral and the method further includes driving the legacy input/output peripheral as a function of said model.

10. The method of claim 1, further comprising:
modeling the new peripheral hardware in a register transfer level simulator; and
interfacing said register transfer level simulator with said register space.

11. A system for developing new peripheral code for use in conjunction with new peripheral hardware having at least one core register, comprising:
a central processing unit (CPU);
memory in operative communication with said CPU and including register space corresponding to the at least one core register of the new peripheral hardware;
system software stored in said memory for execution by said CPU so as to provide an existing operating environment;
a model of the new peripheral hardware mapped to said register space; and
development code, stored in said memory and executable by said CPU, that includes instructions for functionally interacting with said model via said register space.

12. The system of claim 10, wherein said model of the new peripheral hardware is stored in said memory, said model executable on said CPU in conjunction with said development code so as to simulate the new peripheral hardware.

13. The system of claim 11, wherein said development code includes instructions for making deposits to said register space and said model includes instructions for polling said register space for said deposits.

14. The system of claim 12, wherein said preexisting integrated system executes said model as a periodic thread.

15. The system of claim 12, wherein said preexisting integrated system executes said model as a periodic non-maskable interrupt.

16. The system of claim 12, wherein said model includes instructions for generating responses to said deposits and for depositing said responses in said register space.

17. The system according to claim 11, wherein said preexisting integrated system further includes an interrupt controller and said core model includes instructions for pushing a response signal to said interrupt controller.

18. The system according to claim 11, wherein said preexisting integrated system further includes a legacy input/output peripheral and said preexisting integrated system drives said legacy input/output peripheral as a function of said model.

19. The system according to claim 10, further comprising a hardware descriptive language (HDL) simulator containing an HDL simulation of the new hardware core interfaced with the memory location of the preexisting integrated system.

20. A method of developing peripheral code for new peripheral hardware, the peripheral code configured to run in a first operating environment, comprising:
providing first development code corresponding to the peripheral code;
providing an embedded model of the new peripheral hardware;
mapping said embedded model to memory-mapped input/output (MM I/O) space;
executing said first development code and said embedded model so that said first development code and said embedded model interact with each other via said MM I/O space;
providing second development code corresponding to the peripheral code;
providing a non-embedded model of the new peripheral hardware;
mapping said non-embedded model to said MM VO space; and
executing said second development code and said non-embedded model so that said second development code and said non-embedded model interact with each other via said MM I/O space.

21. The method according to claim 20, wherein said first development code and said second development code correspond to the peripheral code at differing stages of development.

* * * * *